(12) United States Patent
Jaeger et al.

(10) Patent No.: US 8,047,761 B2
(45) Date of Patent: Nov. 1, 2011

(54) DEVICE FOR THE SEPARATION OF SUBSTRATES FROM A STACK

(75) Inventors: Felix Jaeger, Stockach (DE); Wolfgang Schmutz, Zimmern (DE); Michael Kieninger, Weinheim (DE)

(73) Assignee: ACI ecoTec GmbH, Zimmern ob Rottweil (DE)

( * ) Notice: Subject to any disclaimer, the term of this patent is extended or adjusted under 35 U.S.C. 154(b) by 344 days.

(21) Appl. No.: 11/920,509

(22) PCT Filed: May 18, 2006

(86) PCT No.: PCT/EP2006/004699
§ 371 (c)(1),
(2), (4) Date: Nov. 16, 2007

(87) PCT Pub. No.: WO2006/125559
PCT Pub. Date: Nov. 30, 2006

(65) Prior Publication Data
US 2008/0135186 A1 Jun. 12, 2008

(30) Foreign Application Priority Data

May 21, 2005 (DE) .......................... 10 2005 023 618

(51) Int. Cl.
*B65H 3/06* (2006.01)
*B65H 5/22* (2006.01)
(52) U.S. Cl. ...................... 414/797.7; 271/137; 271/165
(58) Field of Classification Search .................. 221/237, 221/259, 262; 271/124; 414/797.3, 797.4, 414/979.6, 797.7, 797.8, 797.9, 798.7, 798.8
See application file for complete search history.

(56) References Cited

U.S. PATENT DOCUMENTS

| 1,976,788 | A | * | 10/1934 | Kurth | 271/35 |
| 3,625,384 | A | * | 12/1971 | Boerger et al. | 414/413 |
| 3,707,752 | A | * | 1/1973 | Brafford et al. | 492/52 |
| 3,988,017 | A | * | 10/1976 | Kyhl | 271/111 |
| 4,524,558 | A | * | 6/1985 | Miles | 53/157 |
| 4,653,742 | A | * | 3/1987 | Sasaki et al. | 271/114 |
| 4,961,566 | A | * | 10/1990 | Labombarde | 271/35 |
| 5,006,042 | A | * | 4/1991 | Park | 414/795.4 |
| 5,050,852 | A | * | 9/1991 | Sawada et al. | 271/11 |
| 5,172,898 | A | * | 12/1992 | Takahashi | 271/10.11 |
| 5,297,785 | A | * | 3/1994 | Ricciardi | 271/3.18 |
| 5,451,038 | A | * | 9/1995 | Hosking et al. | 271/3.01 |
| 5,451,042 | A | * | 9/1995 | Cuir et al. | 271/112 |
| 6,543,760 | B1 | * | 4/2003 | Andren | 271/99 |
| 7,036,815 | B2 | * | 5/2006 | Yamamoto | 271/124 |

FOREIGN PATENT DOCUMENTS

EP 0 414 157 A2 2/1991
JP 04354746 A * 12/1992

* cited by examiner

Primary Examiner — Gregory Adams
(74) Attorney, Agent, or Firm — Bacon & Thomas, PLLC

(57) ABSTRACT

A device for separation of damp silicon wafers from a wafer stack, whereby the damp wafers may be removed individually from the stack, transferred to a subsequent conveyor device and the damp thin fragile wafers held in the stack can be rapidly separated and isolated even in large format. The device comprises separation rollers on which the wafer stack may be placed. On rotation of the separation rollers, the lowest wafer is displaced under a doctor strip through a wafer-thin gap between the roller plane and doctor strip and withdrawn from the wafer stack by elastic pressure by a pair of superimposed delivery rollers driven at the same speed.

4 Claims, 1 Drawing Sheet

DEVICE FOR THE SEPARATION OF SUBSTRATES FROM A STACK

TECHNICAL FIELD

The instant invention relates to a device for separating substrates from a stack, in particular of moist silicon wafers from a wafer stack.

BACKGROUND DISCUSSION

Wafers of silicon for producing photovoltaic cells are cut from the block with the aid of wire saws, the same as in micro-electronics. Previously, this block had been glued together with a glass plate in order to achieve the required support for a complete cut-through. Afterwards, the individual cells only adhere to the gluing seam, because the wire saw also penetrates into the glass block. The sawing process takes place under continuous rinsing with a special medium which mixes with the grains generated during sawing. The wafers solidly adhere to each other in clumps because of this pasty mix, for example, and are very difficult to separate from each other for further processing.

Added to this in a further impeding way is the fact that up to the processing step the wafers need to be kept continuously moist.

Up to now, the wafers were manually cut off in clumps from the gluing seam and were separated between the thumb and the middle finger by pulling off the topmost wafer. However, the mass production process which in the meantime is performed in connection with the production of photovoltaic cells requires an automatic process. Added to this is that the wafer formats continue to become larger.

At present, a wafer size of 156×156 cm has been reached, and the trend is toward 210×210 cm. At that time at the latest, for ergonomical reasons it will no longer be possible to manually separate the wafers.

In connection with an arrangement of the type mentioned at the outset and known from DE 199 04 834, the wafer stack is maintained on a support arm of a lifting device and dipped into a liquid, wherein the individual silicon wafers, still glued to a glass support plate, are horizontally arranged. The respectively uppermost wafer is separated from the glass plate with the aid of a tool and is conveyed to a cassette by means of a flow of liquid used as the conveying medium. The required cut-off of each individual silicon wafer requires time and holds the danger of damage to the edge of the respective silicon wafer. Moreover, grasping the separated silicon wafer out of the flow of liquid contains problems, because the individual silicon wafers can flip from their horizontal position out of the adhesive connection with the glass support plate, so that their exterior edge can adhere on the following lower silicon wafer. This problem becomes all the more serious, the larger the format of the silicon wafers is.

SUMMARY OF THE INVENTION

It is therefore an object of the present invention to provide a device which dependably and rapidly separates the moist and fragile wafers, even of large format, maintained in the stack, and separates them.

A device for separating substrates from a stack, in particular of moist silicon wafers from a wafer stack of the type mentioned, has a strip-off bar, a pair of extraction rollers, and separating rollers. The wafer stack is placed on the separating rollers such that the lowermost wafer can be pushed underneath the strip-off bar through a gap of wafer thickness between the roller plane and the strip-off bar, and is then pulled out of the wafer stack by the elastic pressure from the pair of extraction rollers. To do this the pair of extraction rollers and the separating rollers are driven at the same speed.

It is achieved by means of the steps in accordance with the invention that it is possible to pull the respective individual moist silicon wafers, which have already been separated from the glass support plate and are located flat on top of each other in a wafer stack, from the underside of the stack in a simple and rapid manner. In this way damage to the edges of the wafers is avoided.

This type of removing a silicon wafer from a wafer stack is independent of the format of the wafers.

By means of a conveying device constituted by one or several conveying elements it has been achieved that dependable further conveying is assured and that a distance between the separated wafers, which is desired for further processing, is provided.

It is achieved by means of the provision of preferably rectangular grooves between preferably rectangular strips that the required liquid film is maintained in the groove area of the separating rollers and excess liquid can flow off.

By means of the provision whereby the grooves and strips between rollers are respectively offset from each other by one division, and/or, the grooves and strips of adjoining rollers mesh with each other it is achieved that the distance between rollers can be kept closer in order to support the thin fragile wafers even better.

It is achieved by means of the provision of a plunger whereby the wafer stack can be pressed against the separating rollers and/or, the pressure force of the plunger can be regulated in such a way that the sum of the weight of the stack and the pressure force is kept constant with the decrease in the height of the stack that the gap between the strip-off bar and the resilient roller plane can be maintained constant, i.e. at a wafer thickness, by keeping the contact force against the elastic separating rollers constant in spite of a decreasing wafer stack.

Further details of the invention ensue from the following description, in which the invention is described and explained in greater detail by means of the exemplary embodiment represented in the drawings. Shown are in:

DETAILED DESCRIPTION

Figure 1:
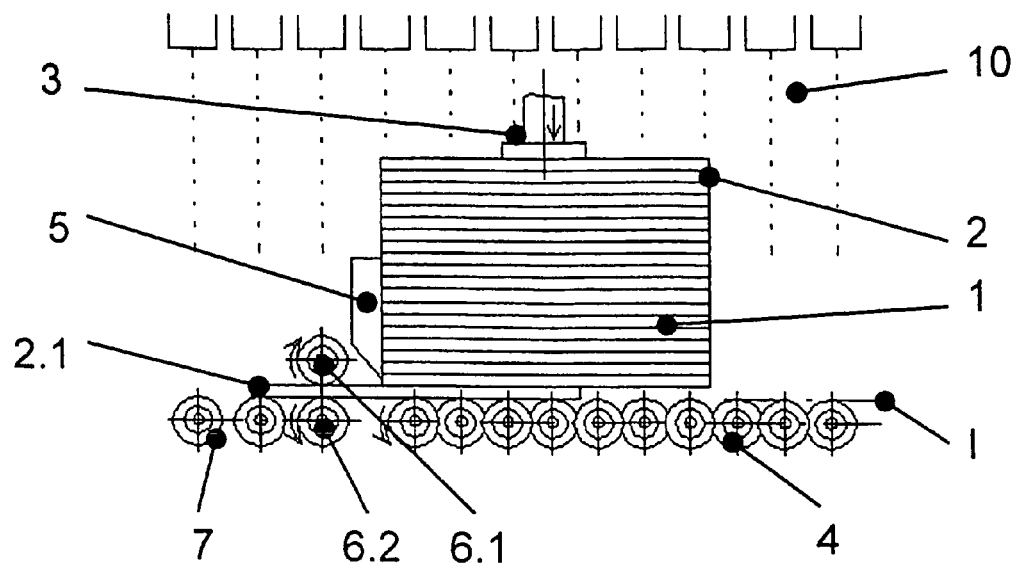
FIG. 1, in a schematic front view the wafer stack resting on separating rollers, which is pushed against them by a plunger, having the strip-off bar, the pair of extraction rollers, between which a half extracted wafer is just located, and the following conveying elements.

A wafer stack 1 consisting of silicon wafers 2 can be seen in FIG. 1, which are produced by taking a silicon block adhering to a glass support plate by means of a glued connection and cut into a plurality of silicon wafers 2 by means of a wire saw and, following cutting by the wire saw, the silicon wafers 2 are cut off or separated at the connecting or gluing seam from the bottom of the glass support plate. The wafer stack 1 of moist silicon wafers 2 resting flat on top of each other has been placed on separating rollers 4, which continuously rotate during removal from the stack. The wafers 2 are kept continuously moist by means of a sprinkler installation 10 making the removal from the stack easier for the following process. A plunger 3 of a controlled pressure force keeps the contact force constant on the separating rollers, whose exterior circumference is elastic, and therefore resilient, regardless of the height of the wafer stack. By means of this it is achieved that the gap between the separating roller plane 11 and the strip-off bar 5 is constantly maintained at slightly more than the wafer thickness, so that only a thin wafer 2 can be pushed, or pulled, through, and the remainder of the stack 1 is kept back.

As soon as the separating rollers 4 have pushed the lowermost wafer 2.1 out for a distance by means of frictional contact, the separating process is aided by extraction rollers 6.1 and 6.2, which are placed as a pair on top of each other. The extraction rollers 6.1 and 6.2 are driven at the same number of revolutions and exert elastic pressure on the respective silicon wafer 2.1, in the course of which a frictional connection between the extraction rollers 6.1, 6.2 and the silicon wafer 2.1 is created. The elastic pressure is achieved, for example, by means of an elastically prestressed seating of the upper extraction roller 6.1. Then, the extraction rollers 6.1, 6.2 transfer the wafer 2.1 to following conveying elements 7, which can be embodied as a roller track or small roller track, as conveying strips or conveyor belts, or in any other suitable manner.

Figure 2:
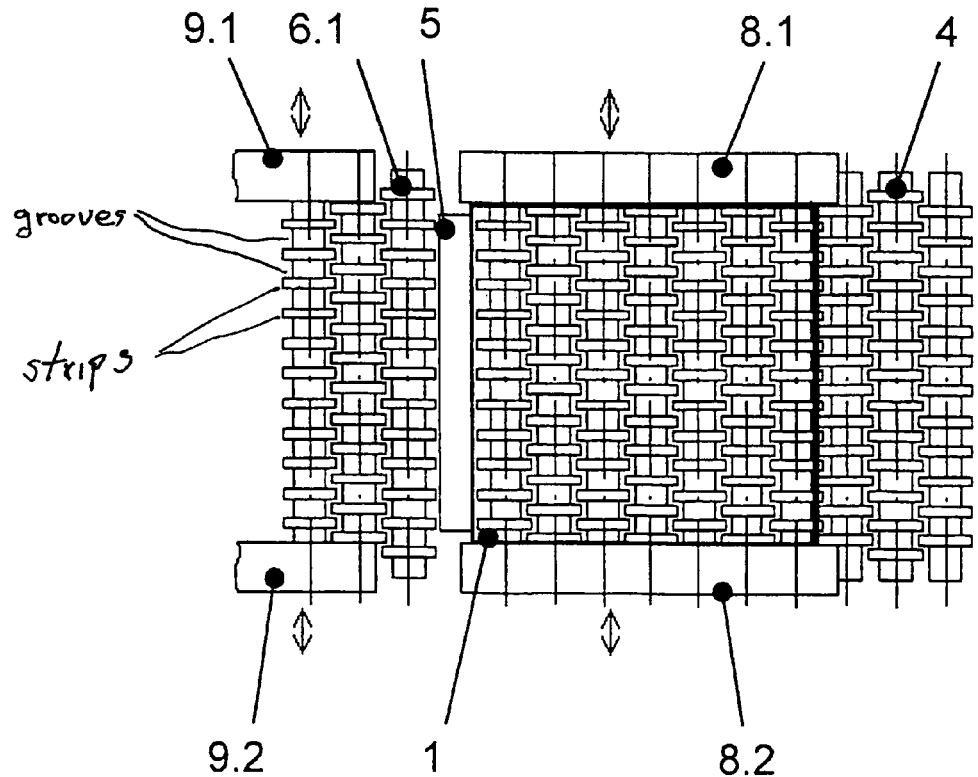
FIG. 2, in a schematic view from above the interlocking stepped rollers with the position of the wafer stack, the adjustable lateral guide strips, prior to and following the separation, as well as the strip-off bar and the upper extraction roller.

The interlocking of the stepped rollers 4, 6.1 and 6.2 and, if required 7, constituted by lining up preferably rectangular grooves and strips with the position of the wafer stack 1, is represented in particular in FIG. 2. The device is complemented by the guide strips 8.2, 8.2 and 9.1, 9.2, by means of which the wafer stack 1 is laterally positioned as a function of the wafer format and the separated silicon wafers 2 are guided.

The invention claimed is:

1. A device for separating moist silicon wafers from a wafer stack, the moist wafers being individually removable from the wafer stack, comprising:

separating rollers on which the wafer stack is placed;
a strip-off bar, which defines a gap with said separating rollers, said gap having a thickness slightly more than the thickness of a moist silicon wafer;
a plunger which engages the wafer stack; and
a pair of extraction rollers, wherein:
said plunger presses against the wafer stack;
the wafer stack is placed on said separating rollers and is subject to the pressing of said plunger, such that the lowermost moist silicon wafer can be pushed underneath said strip-off bar through said gap by the rotation of said separating rollers and can be pulled out of the wafer stack by the elastic pressure from said pair of extraction rollers aligned vertically with respect to each other and driven at the same number of revolutions as said separating rollers; and
said extraction rollers are provided with rectangular grooves between rectangular strips,
a conveying device constituted by one or several conveying elements; and
said conveying elements adjoin said separating rollers and have a higher conveying speed than said separating rollers.

2. The device in accordance with claim 1, wherein:
said grooves and strips between roller are respectively offset from each other by one division.

3. The device in accordance with claim 1, wherein:
said grooves and strips of adjoining rollers mesh with each other.

4. The device in accordance with claim 1, wherein:
the pressure force of said plunger can be regulated in such a way that the sum of the weight of the stack and the pressure force is kept constant with the decrease of the height of the stack.

* * * * *